(12) United States Patent
Ju et al.

(10) Patent No.: US 10,148,023 B1
(45) Date of Patent: Dec. 4, 2018

(54) ELECTRICAL CONNECTOR

(71) Applicant: LOTES CO., LTD, Keelung (TW)

(72) Inventors: Ted Ju, Keelung (TW); Zuo Feng Jin, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/862,806

(22) Filed: Jan. 5, 2018

(30) Foreign Application Priority Data

Sep. 15, 2017 (CN) .......................... 2017 1 0833114

(51) Int. Cl.
*H01R 12/00* (2006.01)
*H01R 12/57* (2011.01)
*H01R 13/41* (2006.01)
*H01R 12/52* (2011.01)
*H01R 33/74* (2006.01)
*H05K 3/34* (2006.01)
*H01R 13/24* (2006.01)
*H01R 43/02* (2006.01)
*H01R 12/70* (2011.01)
*H01R 12/71* (2011.01)

(52) U.S. Cl.
CPC .............. *H01R 12/57* (2013.01); *H01R 12/52* (2013.01); *H01R 12/7076* (2013.01); *H01R 12/714* (2013.01); *H01R 13/2442* (2013.01); *H01R 13/41* (2013.01); *H01R 33/74* (2013.01); *H05K 3/3426* (2013.01); *H01R 12/707* (2013.01); *H01R 12/716* (2013.01); *H01R 43/0256* (2013.01); *H05K 2203/041* (2013.01)

(58) Field of Classification Search
CPC ................ H01R 12/707; H01R 12/526; H01R 43/0235; H01R 43/0256
USPC ..................................................... 439/83, 877
See application file for complete search history.

(56) References Cited

FOREIGN PATENT DOCUMENTS

| CN | 1398018 A | 2/2003 |
|---|---|---|
| CN | 202817260 U | 3/2013 |

*Primary Examiner* — Hien Vu
(74) *Attorney, Agent, or Firm* — Locke Lord LLP; Tim Tingkang Xia, Esq.

(57) ABSTRACT

An electrical connector includes an insulating body, provided with multiple accommodating holes penetrating therethrough, multiple terminals, and multiple solder posts. Each terminal is located in a corresponding accommodating hole and provided with a retaining portion. Each solder post is provided with a base, a fixing portion extending upward from the base, and a welding portion extending downward from the base. The base has a first surface, the welding portion has a second surface, and the first surface and the second surface are connected to form an intersecting angle. A width of the base is greater than a width of the fixing portion, and the width of the base is greater than a width of the welding portion. A corresponding retaining portion retains the fixing portion, and the welding portion is located outside the corresponding retaining portion.

19 Claims, 10 Drawing Sheets

ELECTRICAL CONNECTOR

CROSS-REFERENCE TO RELATED PATENT APPLICATION

This application claims priority to and the benefit of, pursuant to 35 U.S.C. § 119(a), patent application Serial No. CN201710833114.8 filed in China on Sep. 15, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and more particularly to an electrical connector for connecting a chip module to a circuit board.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An existing electrical connector comprises an insulating body, a plurality of terminals and a plurality of solder posts. Each terminal is provided with a retaining portion; and each solder post is provided with a base and a fixing portion extending upwards from the base, each base is semispherical, and each fixing portion is cylindrical and stably and fixedly retained by the retaining portion. During assembling, each base is generally clamped through a clamp and assembled into the corresponding retaining portion from bottom to top; since the bases are semispherical, the clamp makes contact with the outer surfaces of the bases when the bases are clamped by the clamp to be assembled into the retaining portions; since the outer surfaces of the bases are arc, the contact force, for clamping the outer surfaces of the bases, of the clamp is nonuniform, and therefore relative displacement between the clamp and the outer surfaces of the bases is prone to occurring, that is, the bases are prone to sliding in the clamp, and during assembling, the solder posts are prone to falling off from the clamp.

Therefore, a heretofore unaddressed need to design an improved electrical connector exists in the art to address the aforementioned deficiencies and inadequacies.

SUMMARY

In view of the above problem in the related art, an objection of the present invention is to provide an electrical connector which is easy to assemble and capable of stably and fixedly holding solder posts.

To achieve the foregoing objective, the present invention adopts the following technical solutions.

An electrical connector includes: an insulating body, provided with a plurality of accommodating holes penetrating therethrough; a plurality of terminals, wherein each of the terminals is located in a corresponding one of the accommodating holes, and provided with a retaining portion; and a plurality of solder posts, retained by the retaining portions of the terminals, wherein each of the solder posts is provided with a base, a fixing portion extending upward from the base, and a welding portion extending downward from the base; the base has a first surface, the welding portion has a second surface, and the first surface and the second surface are connected to form an intersecting angle; a width of the base is greater than a width of the fixing portion, and the width of the base is greater than a width of the welding portion; and a corresponding one of the retaining portions retains the fixing portion, and the welding portion is located outside the corresponding retaining portion.

In certain embodiments, a height of the welding portion is greater than a height of the fixing portion.

In certain embodiments, the base has an upper plain surface, and the corresponding retaining portion downward abuts the upper plain surface.

In certain embodiments, the fixing portion gradually shrinks in a direction away from the upper plain surface.

In certain embodiments, the first surface is a plain surface, and the welding portion gradually enlarges in a direction away from the first surface.

In certain embodiments, the first surface is a plain surface, the welding portion gradually shrinks in a direction away from the first surface, and an inclined angle of the welding portion is smaller than an inclined angle of the fixing portion.

In certain embodiments, a top end of the fixing portion and a bottom end of the welding portion are arranged with chamfers.

In certain embodiments, the welding portion is cylindrical.

In certain embodiments, the fixing portion and the welding portion are vertically symmetrical with respect to the base.

In certain embodiments, cross sections of the fixing portion, the base and the welding portion are all circles.

In certain embodiments, each of the terminals is provided with a main body portion connected with the corresponding retaining portion; the main body portion, the corresponding retaining portion and an inner wall of the corresponding accommodating hole define a retaining space; the fixing portion is located in the retaining space; the main body portion is located above the fixing portion to limit the fixing portion, and the base and the welding portion are located outside the retaining space.

In certain embodiments, a gap exists between the corresponding retaining portion and the inner wall of the corresponding accommodating hole, and the corresponding retaining portion partially enters the gap when the fixing portion is pressed into the retaining space.

In certain embodiments, the main body portion is provided with an elastic sheet; and a stopping wall is correspondingly provided in the corresponding accommodating hole and located above the elastic sheet to stop the elastic sheet.

In certain embodiments, each of the terminals is provided with an elastic arm, the elastic arm is provided with a contact portion, and the contact portion is located above the insulating body to abut a chip module.

In certain embodiments, the retaining portion is provided with at least one retaining arm holding the fixing portion, and the fixing portion is in a plane contact with the at least one retaining arm.

In certain embodiments, the at least one retaining arm holds the fixing portion to cover more than half of a perimeter of the fixing portion.

In certain embodiments, the retaining portion is provided with at least two retaining arms, and each of the at least two retaining arms is provided with at least one projecting portion in an elastic contact with the fixing portion.

In certain embodiments, each of the solder posts is made from a solder material through a jig, and the jig is provided with a first jig and a second jig; the first jig is provided with a first groove, the second jig is correspondingly provided with a mating groove and a second groove, and the mating groove communicates with the second groove; a width of the mating groove is greater than a width of the second groove, and the solder material is located in the mating groove; the first jig mates with the second jig and moves relative to second jig to squeeze the solder material into the solder post; an end of the first jig urges against the solder material, and the first jig and the second jig move relative to each other to form the base; the base is located in the mating groove, and a profile of the base matches with a profile of the mating groove; a height of the mating groove is equal to a height of the base, and the width of the mating groove is equal to a width of the base; the fixing portion is located in the first groove, and a profile of the fixing portion matches with a profile of the first groove; and the welding portion is located in the second groove, and a profile of the welding portion matches with a profile of the second groove.

In certain embodiments, the base is provided with an upper plain surface, the fixing portion gradually shrinks in a direction away from the upper plain surface, and a top end of the fixing portion is arranged with chamfers; the first groove correspondingly gradually shrinks in a first direction away from the mating groove, and a bottom end of the first groove is arranged with chamfers; the first surface is a plain surface; the welding portion gradually shrinks in a direction away from the first surface, an inclined angle of the welding portion is smaller than an inclined angle of the fixing portion, and a bottom end of the welding portion is arranged with chamfers; and the second groove correspondingly gradually shrinks in a second direction away from the mating groove and opposite to the first direction, an inclined angle of the second groove is smaller an inclined angle of the first groove, and a bottom end of the second groove is arranged with chamfers.

In certain embodiments, the solder material is a solder block, a solder ball, or solder powder.

Compared with the related art, the present invention has the following beneficial effects: the solder post is provided with the base, the fixing portion extending upward from the base, and the welding portion extending downward from the base. The base is provided with the first surface, the welding portion is provided with the second surface, and the first surface and the second surface are connected to form the intersecting angle. Each of the terminals is provided with the retaining portion and the main body portion. The main body portion, the retaining portion and the inner wall of the corresponding accommodating hole define the retaining space.

During assembling, a clamp clamps the welding portion and assembles the corresponding solder post into the corresponding retaining space upward from the bottom. The clamp is in a plane contact with the welding portion. Compared with a mode where the clamp clamps the semispherical base, the contact area between the clamp and the welding portion is large and stable, and the contact force of the clamp for clamping an outer surface of the base is uniform. Therefore, the clamp is not prone to have a relative displacement from the outer surface of the base, so that the clamp can stably and tightly clamp the solder post, thereby reducing the assembling difficulty and improving the assembling efficiency. The width of the base is greater than the width of the fixing portion, and the width of the base is greater than the width of the welding portion. The retaining portion and the welding portion are located outside the retaining space. Therefore, the base can prevent the solder post from excessively entering the retaining space, thereby ensuring a sufficient amount of the solder for the solder post, and further guaranteeing the soldering quality.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-10. In accordance with the purposes of this invention, as embodied and broadly described herein, this invention, in one aspect, relates to an electrical connector.

Figure 2:
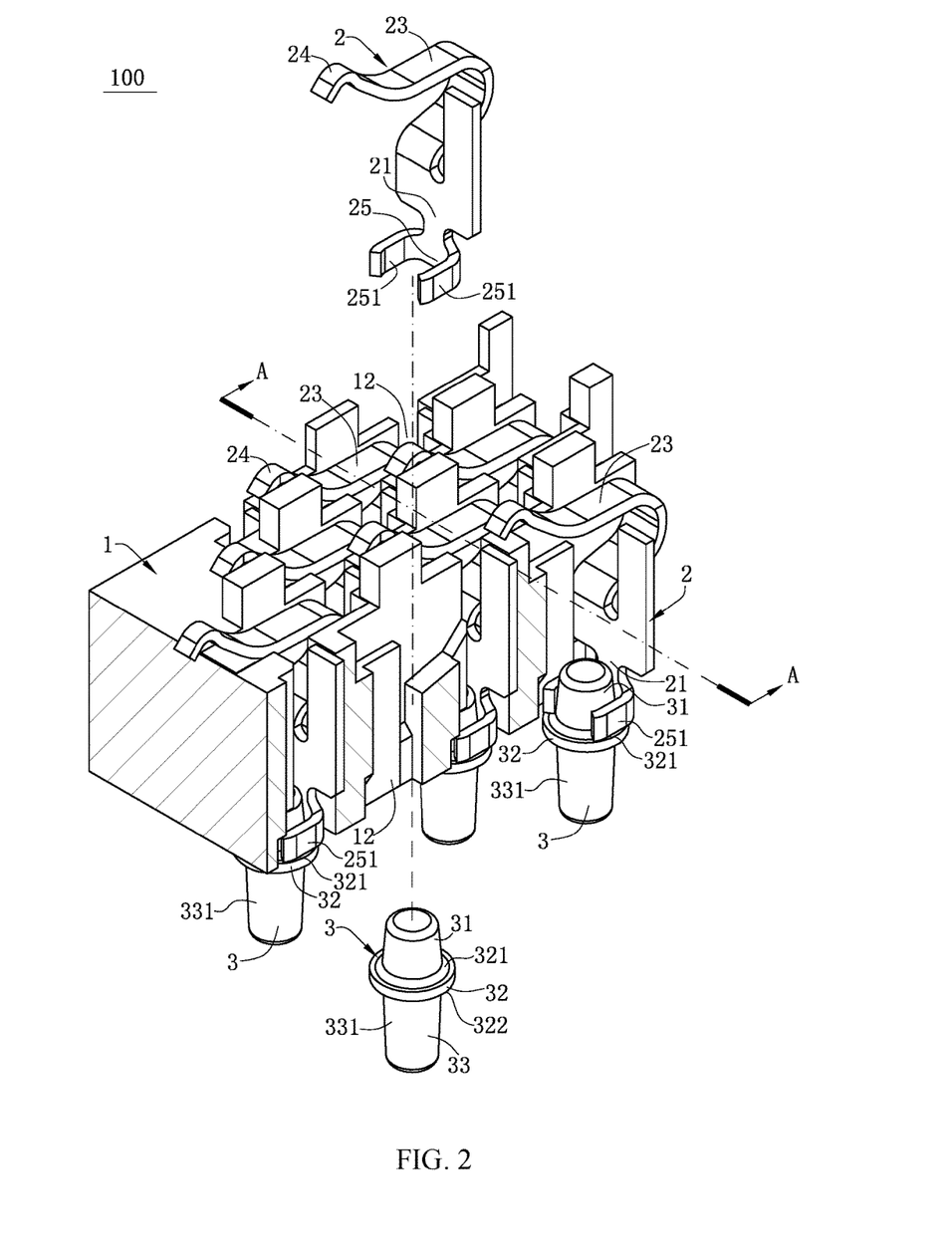
FIG. 2 is a local perspective sectional view of the electrical connector according to the first embodiment of the present invention.
Figure 3:
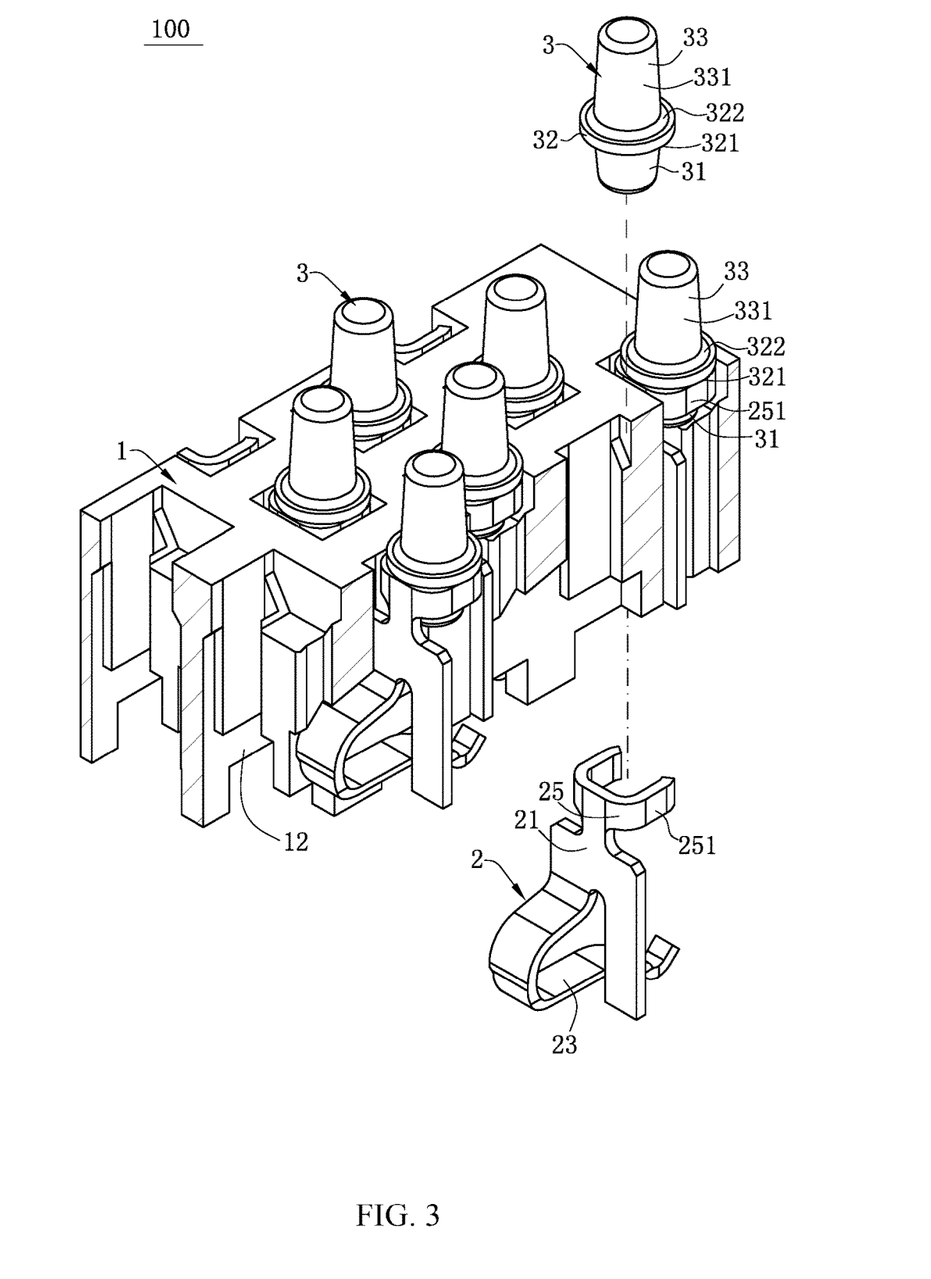
FIG. 3 is a local perspective sectional view of the electrical connector viewed from another viewing angle according to the first embodiment of the present invention.

As shown in FIG. 2, an electrical connector 100 according to a first embodiment of the present invention is shown, the electrical connector 100 includes an insulating body 1, a plurality of terminals 2 and a plurality of solder posts 3.

Figure 6:
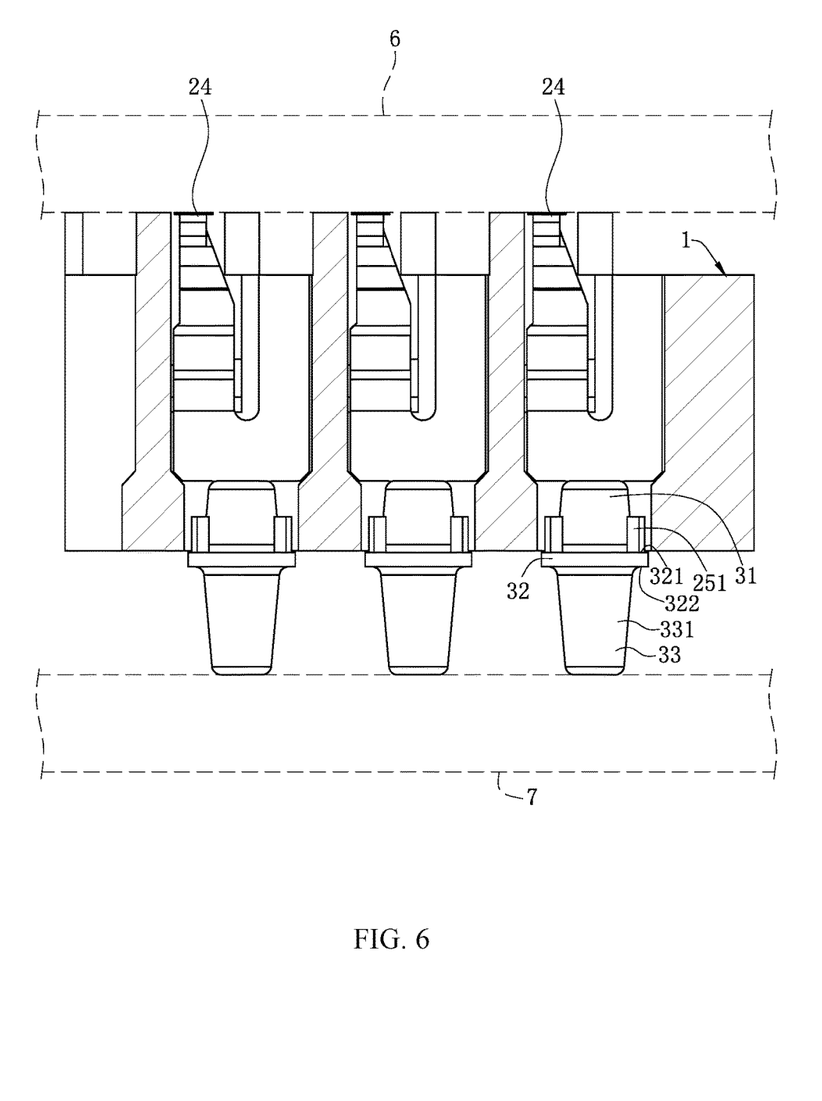
FIG. 6 is a sectional view of connecting a circuit board and a chip module through the electrical connector according to the first embodiment of the present invention.
Figure 7:
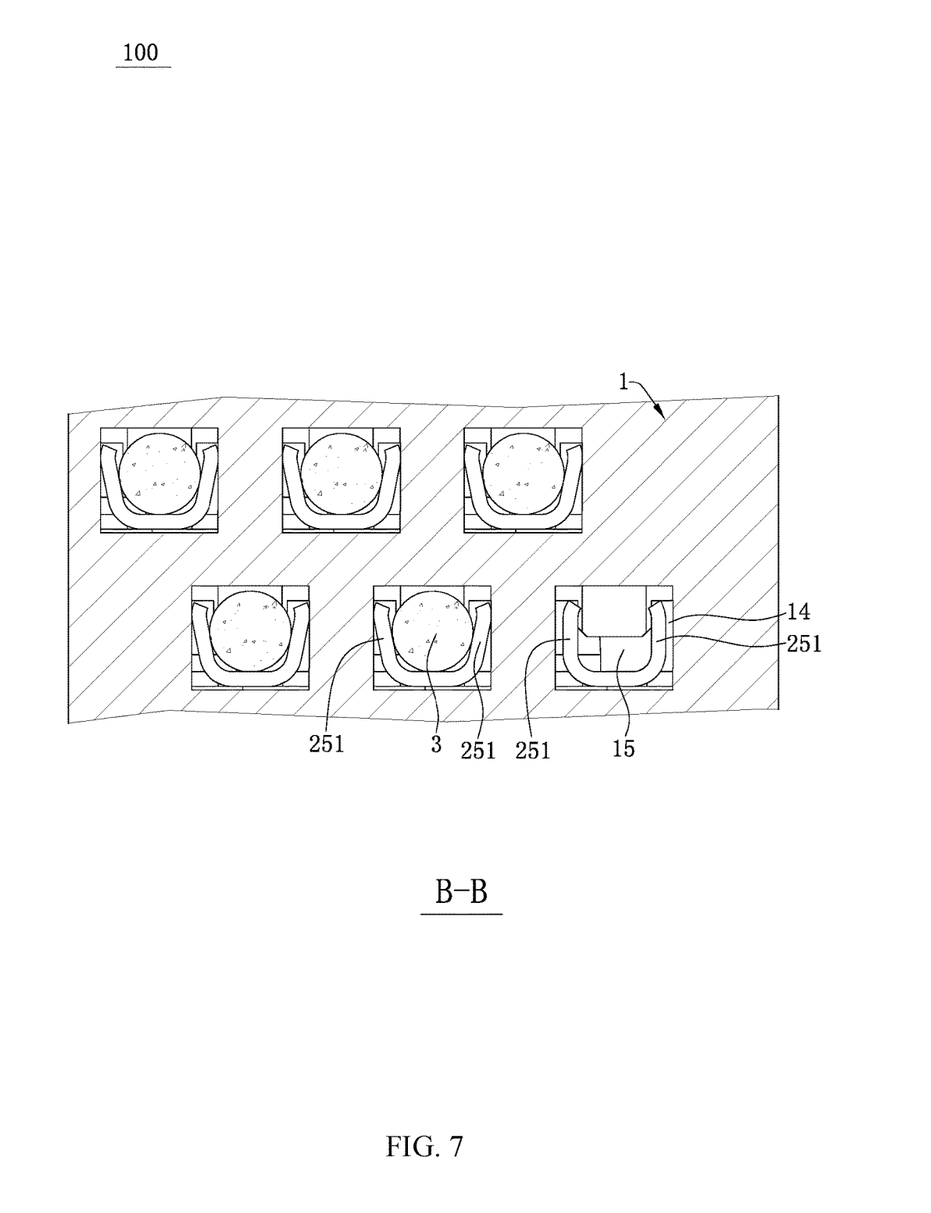
FIG. 7 is a sectional view of FIG. 5 in the B-B direction.

As shown in FIG. 6 and FIG. 7, the insulating body is provided with a plurality of accommodating holes 12 penetrating therethrough. Each terminal 2 is located in a corresponding one of the accommodating holes 12, and each terminal 2 is provided with a main body portion 21. An elastic arm 23 extends upward from the main body portion 21, and the elastic arm 23 is provided with a contact portion 24. The contact portion 24 is located above the insulating body 1, so as to abut a chip module 6. A retaining portion 25 extends downward from the main body portion 21, and the main body portion 21, the retaining portion 25 and an inner wall of the corresponding accommodating hole 12 define a retaining space 15 to accommodate the corresponding solder post 3. The retaining portion 25 is provided with two retaining arms 251. In other embodiments, the retaining portion 25 can also be provided with only one retaining arm 251 or a plurality of retaining arms 251.

Figure 4:
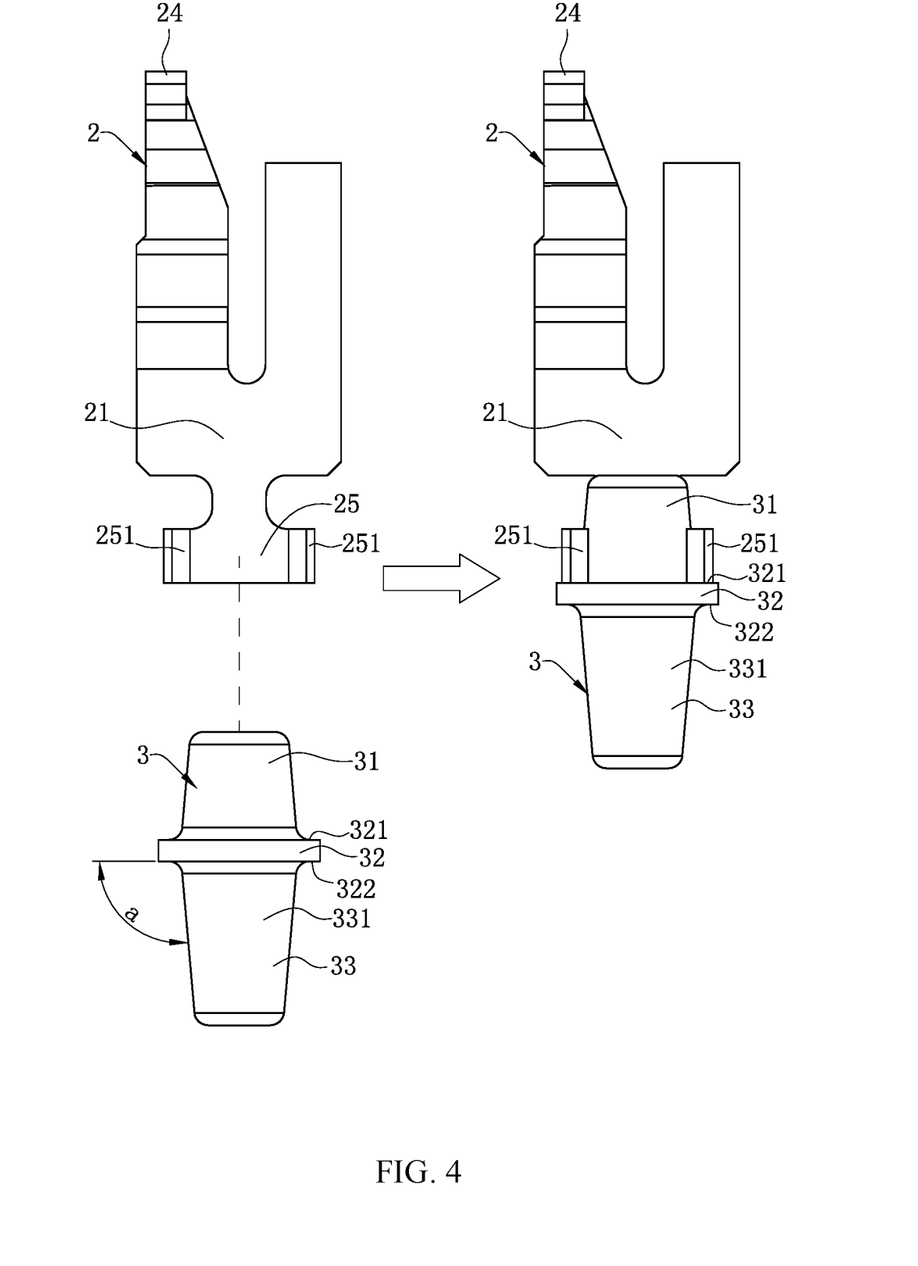
FIG. 4 is a schematic view of a retaining portion retaining a fixing portion of the electrical connector according to the first embodiment of the present invention.

As shown in FIG. 2, FIG. 4 and FIG. 7, each solder post 3 is provided with a base 32. The base 32 has a first surface 322 and an upper plain surface 321, and the first surface 322 is a plain surface opposite to the upper plain surface 321. A fixing portion 31 extends upward from the upper plain surface 321 of the base 32. A welding portion 33 extends downward from the first surface 322 of the base 32. The welding portion 33 is provided with a second surface 331, and the first surface 322 and the second surface 331 are connected to form an intersecting angle a. The intersecting angle a can be an acute angle, a right angle or an obtuse angle. Further, horizontal cross sections of the fixing portion 31, the base 32 and the welding portion 33 are all circles. The fixing portion 31 and the welding portion 33 are vertically symmetrical with respect to the base 32, so as to reduce the manufacturing difficulty for the solder post 3 and improve the manufacturing precision. The retaining portion 25 retains the fixing portion 31, and the fixing portion 31 is located in the retaining space 15. The base 32 and the welding portion 33 are located outside the retaining space 15. A width of the base 32 is greater than a width of the fixing portion 31, and the width of the base 32 is greater than a width of the welding portion 33, so that the base 32 can prevent the solder post 3 from excessively entering the retaining space 15, and the size of the accommodating hole 12 can be relatively reduced. Each retaining arm 251 downward abuts the upper plain surface 321, and a bottom surface of the insulating body 1 partially abuts the upper plain surface 321. A height of the welding portion 33 is greater than a height of the fixing portion 31, thereby ensuring a sufficient amount of the solder, and further guaranteeing the soldering quality.

Figure 5:
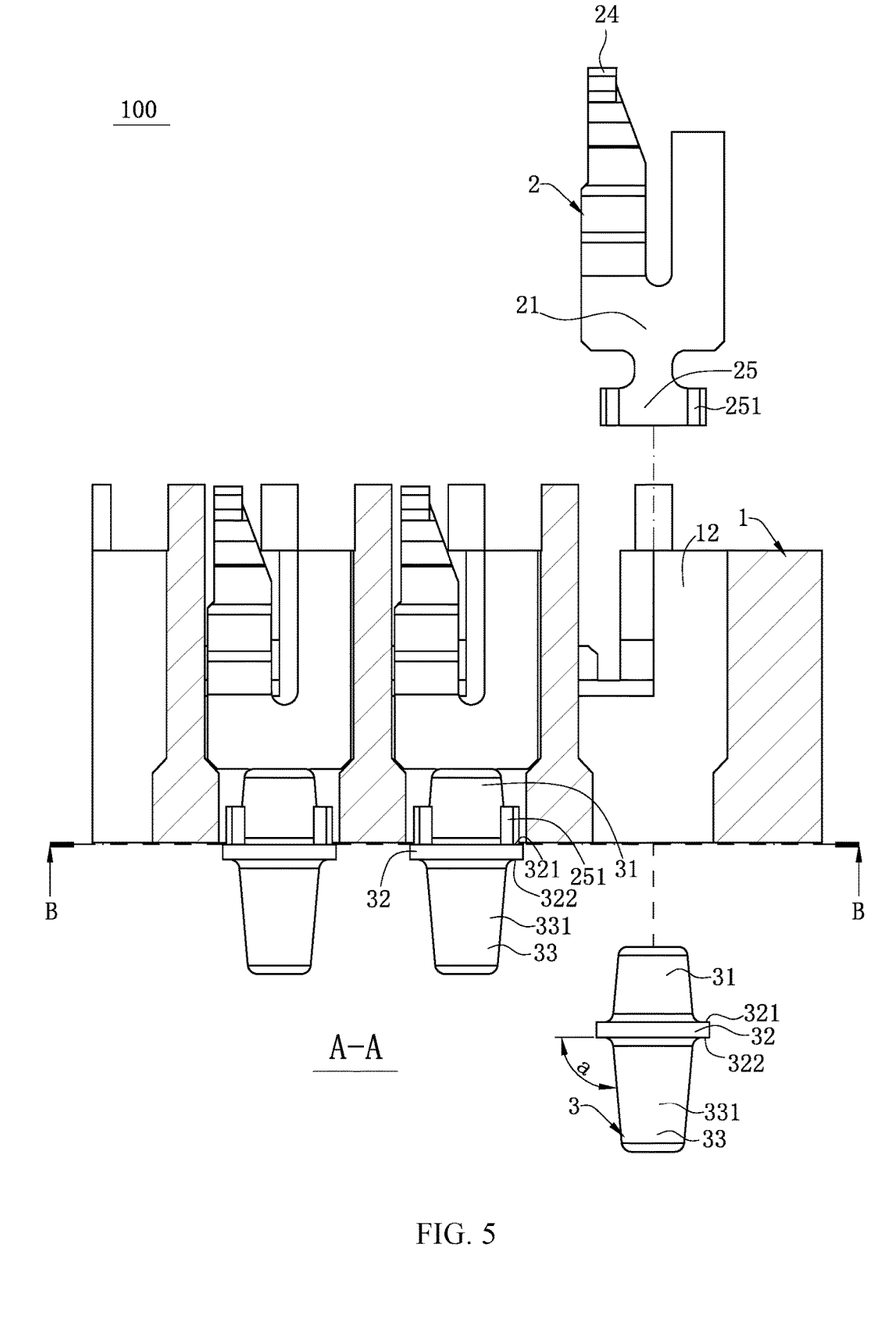
FIG. 5 is a sectional view of FIG. 2 in the A-A direction.

As shown in FIG. 5 and FIG. 7, the fixing portion 31 gradually shrinks in a direction away from the upper plain surface 321, and a top end of the fixing portion 31 is arranged with chamfers, so that the fixing portion 31 is guided to be mounted into the retaining space 15. When the electrical connector 100 is placed into a reflow oven (not shown in figure) to be heated, the contact area between hot gas located above the fixing portion 31 and the fixing portion 31 is increased, and a space for circulation of the hot gas above the fixing portion 31 is also increased.

As shown in FIG. 5 and FIG. 7, a bottom end of the welding portion 33 is arranged with chamfers. During assembling, a clamp (not shown in figure) clamps the welding portion 33 to assemble the corresponding solder post 3 into the retaining space 15 upward from the bottom, thus avoiding collisions when the clamp clamps the welding portion 33 to cause the solder to scatter. The welding portion 33 gradually shrinks in a direction away from the first surface 322, and an inclined angle of the welding portion 33 is smaller than an inclined angle of the fixing portion 31. During assembling, the clamp is in a plane contact with the welding portion 33. Compared with a mode where the clamp clamps the semispherical base 32, the contact area between the clamp and the welding portion 33 is large and stable, and the contact force of the clamp for clamping the outer surface of the base 32 is uniform. Therefore, the clamp is not prone to have a relative displacement from the outer surface of the base 32, so that the clamp can stably and tightly clamp the solder post 3 and assemble the solder post 3 into the retaining portion 25 during assembling, thereby reducing the assembling difficulty and improving the assembling efficiency.

Figure 10:
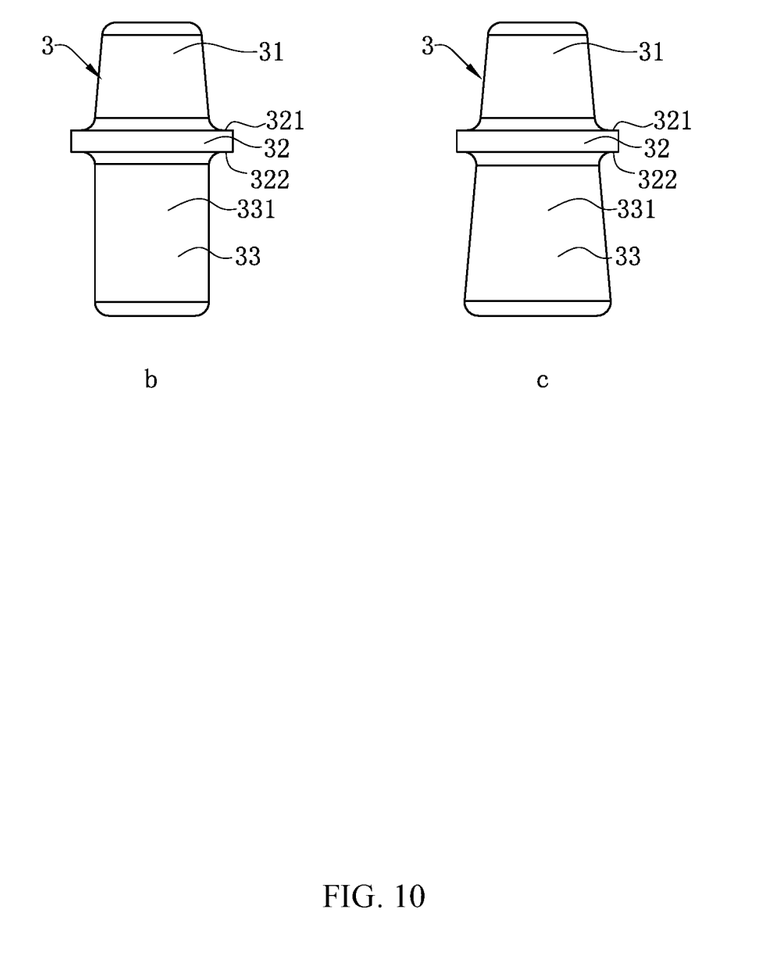
FIG. 10 is a schematic view of the solder posts of the electrical connector according to other embodiments of the present invention.

As shown in FIG. 6 and FIG. 10, b and c show solder posts 3 according to other embodiments. The welding portion 33 as shown in b is cylindrical. When the electrical connector 100 and a circuit board 7 are placed into the reflow oven together to be heated, the circuit board 7 is located under the electrical connector 100, the melting temperature of the corresponding solder post 3 is relatively uniform, and the soldering effect between the electrical connector 100 and the circuit board 7 is further guaranteed. According to the solder post 3 as shown in c, the welding portion 33 gradually enlarges in a direction away from the first surface 322. Compared with the welding portion 33 as shown in b, the welding portion 33 as shown in c has more amount of solder.

As shown in FIG. 7, a gap 14 exists between the retaining portion 25 and the inner wall of the corresponding accommodating hole 12, and the gap 14 functions as a safety distance for micro-deformation of the retaining portion 25. When the fixing portion 31 is pressed into the corresponding retaining space 15, the retaining portion 25 is under the squeezing force to slightly expand outward and be propped open. Thus, the retaining portion 25 partially enters the gap 14, thereby avoiding the retaining portion 25 from colliding with the inner wall of the corresponding accommodating hole 12 and consequentially damaging the insulating body 1. The retaining arm 251 holds the fixing portion 31, and the fixing portion 31 is in a plane contact with the retaining arm 251. Further, the retaining arm 251 holds the fixing portion 31 to cover more than half of a perimeter of the fixing portion 31, so as to ensure that the contact area between the retaining arms 251 and the fixing portion 31 is large, and the retaining arms 251 can stably hold the fixing portion 31.

Figure 8:
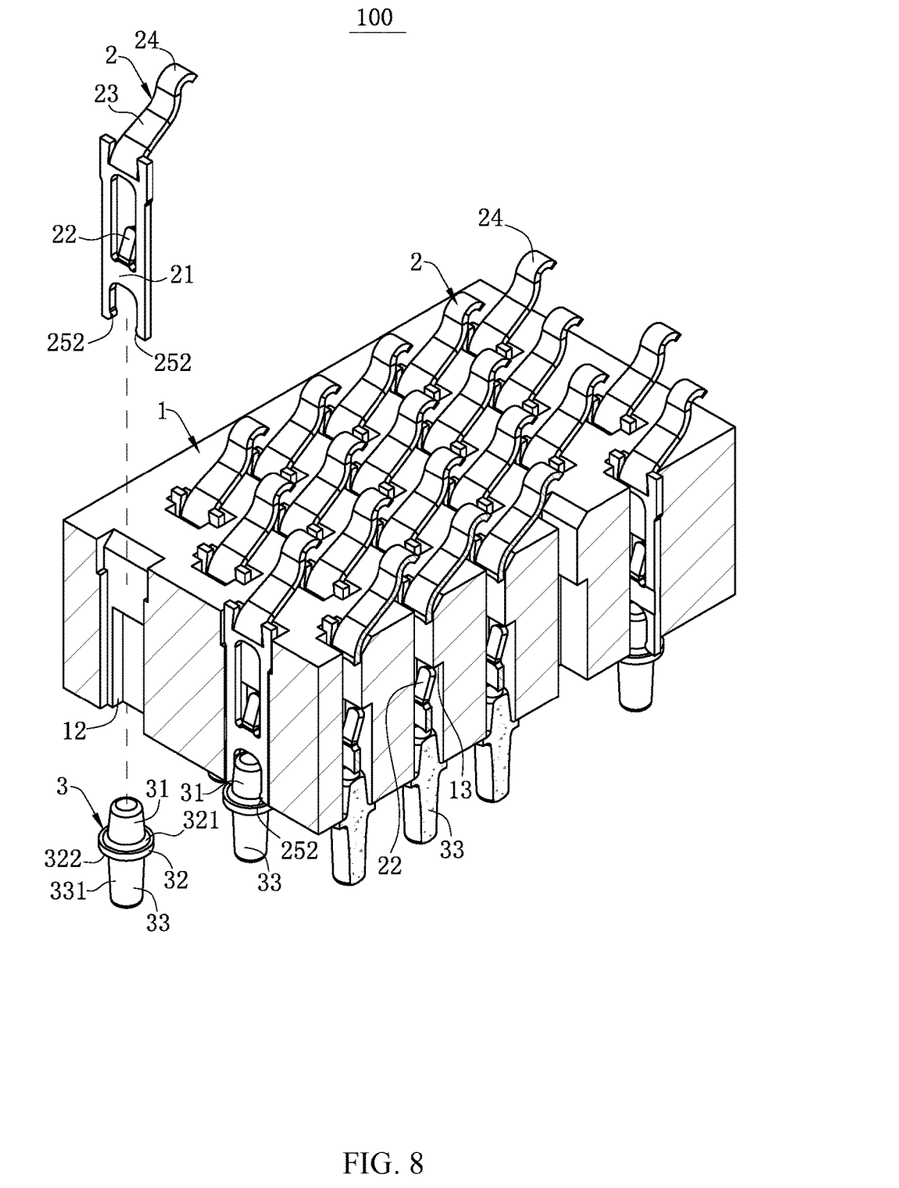
FIG. 8 is a local perspective sectional view of the electrical connector according to the second embodiment of the present invention.
Figure 9:
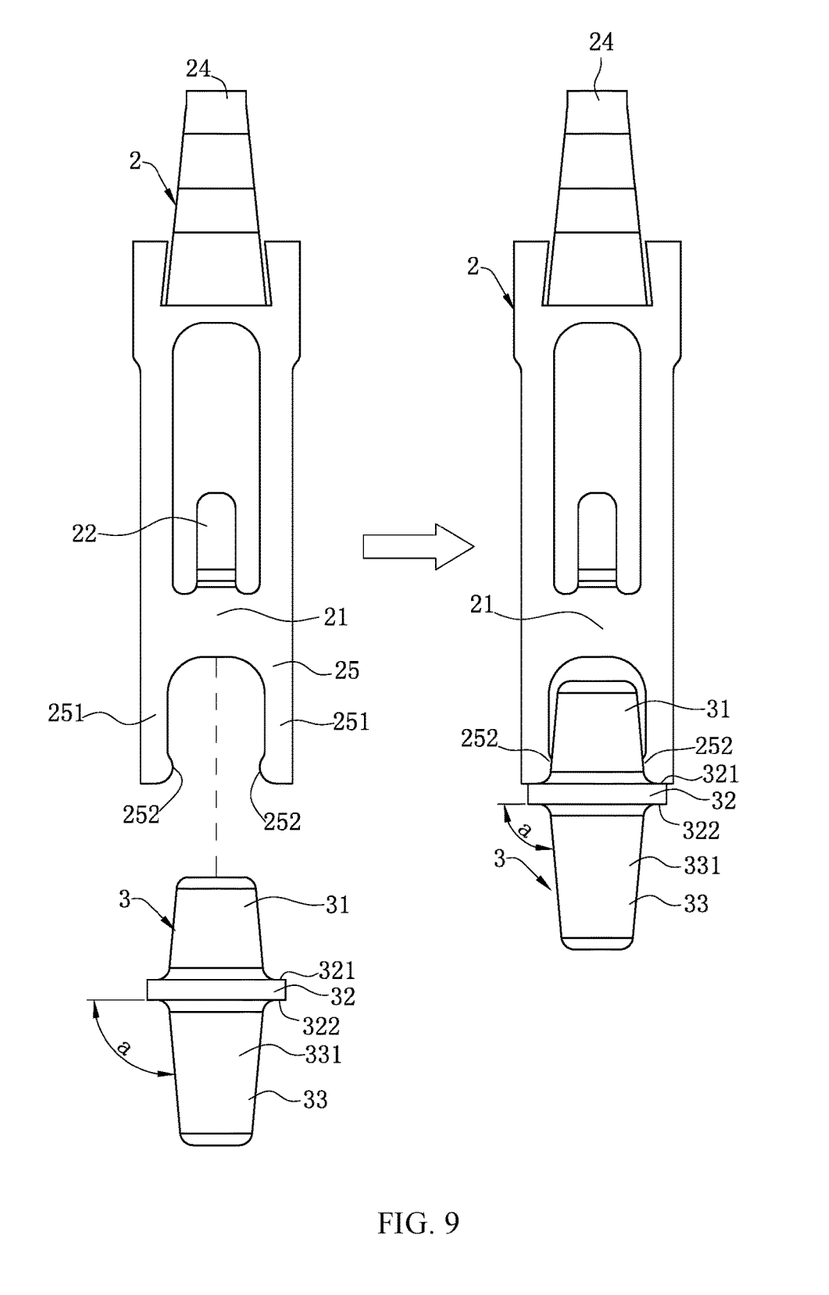
FIG. 9 is a schematic view of each retaining portion retaining the corresponding fixing portion of the electrical connector according to the second embodiment of the present invention.

FIG. 8 and FIG. 9 show an electrical connector 100 according to a second embodiment of the present invention. Each main body portion 21 is located above the upper plain surface 321, so as to limit the fixing portion 31. Each main body portion 21 is provided with an elastic sheet 22. Correspondingly, a stopping wall 13 is provided in the corresponding accommodating hole 12. The stopping wall 13 is located above the elastic sheet 22 to stop the elastic sheet 22, and limit the corresponding terminal 2 within the accommodating hole 12. The two retaining arms 251 are arranged at two opposite sides of the fixing portion 31. Each retaining arm 251 is provided with a projecting portion 252. The projecting portion 252 is in an elastic contact with the fixing portion 31. Since the contact area between each projecting portion 252 and fixing portion 31 is small, when the clamping force of corresponding retaining portion 25 on the fixing portion 31 is fixed, the pressure of each projecting portion 252 on the fixing portion 31 is large, and the contact elasticity between the retaining portion 25 and the fixing portion 31 is higher.

In other embodiments, each retaining arm 251 can be provided with two or more projecting portions 252.

Figure 1:
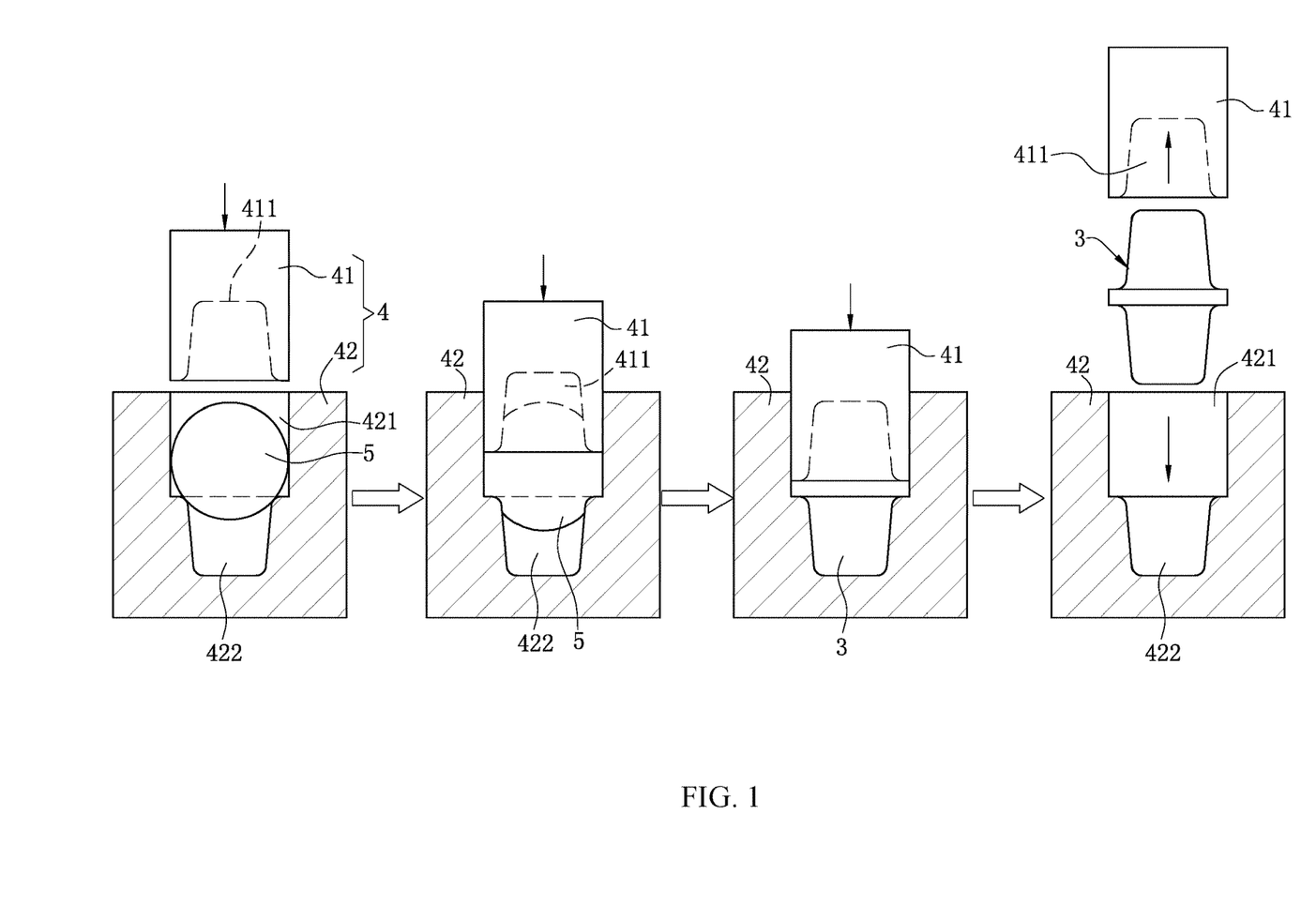
FIG. 1 is a schematic view for a process of making a solder ball into a solder post of an electrical connector according to certain embodiments of the present invention.

As shown in FIG. 1, each solder post 3 is made from a solder material 5 through a jig 4, and the jig 4 is provided with a first jig 41 and a second jig 42. The first jig 41 is provided with a first groove 411, and correspondingly, the second jig body 42 is provided with a mating groove 421 and a second groove 422. The mating groove 421 communicates with the second groove 422. A width of the mating groove 421 is greater than a width of the second groove 422. A profile of the fixing portion 31 matches with a profile of the first groove 411. The fixing portion 31 gradually shrinks in a direction away from the upper plain surface 321, and a top end of the fixing portion 31 is arranged with chamfers. Correspondingly, the first groove 411 gradually shrinks in a first direction (i.e., the upward direction as shown in FIG. 1) away from the mating groove 421, and a bottom end of the first groove 411 is arranged with chamfers. Likewise, a profile of each welding portion 33 matches with a profile of the second groove 422. The welding portion 33 gradually shrinks in a direction away from the first surface 322. An inclined angle of the welding portion 33 is smaller than an inclined angle of the fixing portion 31, and a bottom end of the welding portion 33 is arranged in the chamfered mode. Correspondingly, the second groove 422 gradually shrinks in a second direction (i.e., the downward direction as shown in FIG. 1) away from the mating groove 421 and opposite to the first direction. An inclined angle of the second groove 422 is smaller than an inclined angle of the first groove 411, and a bottom end of the second groove 422 is arranged with chamfers.

As shown in FIG. 1, the solder material 5 is located in the mating groove 421. When the first jig 41 mates with the second jig 42, the first jig 41 and the second jig 42 move relative to each other. That is, the first jig 41 moves toward the second jig 42 and the second jig 42 moves toward the first jig 41. An end of the first jig 41 urges against the solder material 5. The solder material 5 deforms under pressure, and is partially squeezed into the first groove 411 and the second groove 422. The portion of the solder material 5 being filled in the mating groove 421 forms the base 32. A profile of the base 32 matches with a profile of the mating groove 421, a height of the mating groove 421 is equal to a height of the base 32, and the width of the mating groove 421 is equal to a width of the base 32. The portion of the solder material 5 being squeezed into the first groove 411 forms the fixing portion 31, and the portion of the solder material 5 being squeezed into the second groove 422 forms the welding portion 33.

As shown in FIG. 1 and FIG. 10, the solder material 5 is a solder ball. The solder material 5 can be stably embedded into the mating groove 421, and part of the solder material 5 enters the second groove 422. When the first jig 41 mates with the second jig body 42, the first jig 41 can better apply force to the solder material 5, and the solder material 5 may deform and enter the first groove 411 and the second groove 422 more easily. In other embodiments, the solder material 5 can be a solder block or solder powder. When the solder material 5 is the solder block (not shown in figure), the solder block in a diversified or irregular shape can be made into the regular solder post 3. When the solder 5 is the solder powder (not shown in figure), the solder powder is fully filled in the second groove 422, and partially filled in the mating groove 421. When the end of the first jig 41 urges against the solder powder, the solder powder can form the solder post 3 more easily. The solder powder can aggregate more easily, and the size of the solder post 3 can be controlled more precisely.

To sum up, the electrical connector 100 accordingly to certain embodiments of the present invention has the following beneficial effects.

(1) Each solder post 3 is provided with a base 32, a fixing portion 31 extending upward from the base 32, and a welding portion 33 extending downward from the base 32. The base 32 has a first surface 322, the welding portion 33 is provided with a second surface 331, and the first surface 322 and the second surface 331 are connected to form an intersecting angle a. The retaining portion 25 retains the fixing portion 31. The fixing portion 31 is located in the retaining space 15, and the base 32 and the welding portion 33 are located outside the retaining space 15. During assembling, the clamp clamps the welding portion 33 to assemble the corresponding solder post 3 into the retaining space 15 upward from the bottom. The clamp is in a plane contact with the welding portion 33. Compared with a mode where the clamp clamps the semispherical base 32, the contact area between the clamp and the welding portion 33 is large and stable, and the contact force of the clamp for clamping the outer surface of the base 32 is uniform. Therefore, the clamp is not prone to have a relative displacement from the outer surface of the base 32, so that the clamp can stably and tightly clamp the solder post 3 and assemble the solder post 3 into the retaining portion 25, thereby reducing the assembling difficulty and improving the assembling efficiency.

(2) A width of the base 32 is greater than a width of the fixing portion 31, and the width of the base 32 is greater than a width of the welding portion 33, so that the base 32 can prevent the solder post 3 from excessively entering the retaining space 15, and the size of the accommodating hole 12 can be relatively reduced.

(3) The fixing portion 31 and the welding portion 33 are vertically symmetrical with respect to the base 32, so as to reduce the manufacturing difficulty for the solder post 3 and improve the manufacturing precision. A height of the welding portion 33 is greater than a height of the fixing portion 31, thereby ensuring a sufficient amount of the solder, and further guaranteeing the soldering quality.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, comprising:
an insulating body, provided with a plurality of accommodating holes penetrating therethrough;
a plurality of terminals, wherein each of the terminals is located in a corresponding one of the accommodating holes, and provided with a retaining portion; and
a plurality of solder posts, retained by the retaining portions of the terminals, wherein each of the solder posts is provided with a base, a fixing portion extending upward from the base, and a welding portion extending downward from the base; the base has a first surface, the welding portion has a second surface, and the first surface and the second surface are connected to form an intersecting angle; a width of the base is greater than a width of the fixing portion, and the width of the base is greater than a width of the welding portion; and a corresponding one of the retaining portions retains the fixing portion, and the welding portion is located outside the corresponding retaining portion;
wherein each of the terminals is provided with a main body portion connected with the corresponding retaining portion, the main body portion; the corresponding retaining portion and an inner wall of the corresponding accommodating hole define a retaining space; the fixing portion is located in the retaining space; the main body portion is located above the fixing portion to limit the fixing portion, and the base and the welding portion are located outside the retaining space.

2. The electrical connector according to claim 1, wherein a height of the welding portion is greater than a height of the fixing portion.

3. The electrical connector according to claim 1, wherein the base has an upper plain surface, and the corresponding retaining portion downward abuts the upper plain surface.

4. The electrical connector according to claim 3, wherein the fixing portion gradually shrinks in a direction away from the upper plain surface.

5. The electrical connector according to claim 1, wherein the first surface is a plain surface, and the welding portion gradually enlarges in a direction away from the first surface.

6. The electrical connector according to claim 1, wherein the first surface is a plain surface, the welding portion gradually shrinks in a direction away from the first surface, and an inclined angle of the welding portion is smaller than an inclined angle of the fixing portion.

7. The electrical connector according to claim 1, wherein a top end of the fixing portion and a bottom end of the welding portion are arranged with chamfers.

8. The electrical connector according to claim 1, wherein the welding portion is cylindrical.

9. The electrical connector according to claim 1, wherein the fixing portion and the welding portion are vertically symmetrical with respect to the base.

10. The electrical connector according to claim 1, wherein cross sections of the fixing portion, the base and the welding portion are all circles.

11. The electrical connector according to claim 1, wherein a gap exists between the corresponding retaining portion and the inner wall of the corresponding accommodating hole, and the corresponding retaining portion partially enters the gap when the fixing portion is pressed into the retaining space.

12. The electrical connector according to claim 1, wherein the main body portion is provided with an elastic sheet; and a stopping wall is correspondingly provided in the corresponding accommodating hole and located above the elastic sheet to stop the elastic sheet.

13. The electrical connector according to claim 1, wherein each of the terminals is provided with an elastic arm, the elastic arm is provided with a contact portion, and the contact portion is located above the insulating body to abut a chip module.

14. The electrical connector according to claim 1, wherein the retaining portion is provided with at least one retaining arm holding the fixing portion, and the fixing portion is in a plane contact with the at least one retaining arm.

15. The electrical connector according to claim 14, wherein the at least one retaining arm holds the fixing portion to cover more than half of a perimeter of the fixing portion.

16. The electrical connector according to claim 1, wherein the retaining portion is provided with at least two retaining arms, and each of the at least two retaining arms is provided with at least one projecting portion in an elastic contact with the fixing portion.

17. The electrical connector according to claim 1, wherein:

each of the solder posts is made from a solder material through a jig, and the jig is provided with a first jig and a second jig;

the first jig is provided with a first groove, the second jig is correspondingly provided with a mating groove and a second groove, and the mating groove communicates with the second groove;

a width of the mating groove is greater than a width of the second groove, and the solder material is located in the mating groove;

the first jig mates with the second jig and moves relative to second jig to squeeze the solder material into the solder post;

an end of the first jig urges against the solder material, and the first jig and the second jig move relative to each other to form the base;

the base is located in the mating groove, and a profile of the base matches with a profile of the mating groove;

a height of the mating groove is equal to a height of the base, and the width of the mating groove is equal to a width of the base;

the fixing portion is located in the first groove, and a profile of the fixing portion matches with a profile of the first groove; and the welding portion is located in the second groove, and a profile of the welding portion matches with a profile of the second groove.

18. The electrical connector according to claim 17, wherein:

the base is provided with an upper plain surface, the fixing portion gradually shrinks in a direction away from the upper plain surface, and a top end of the fixing portion is arranged with chamfers;

the first groove correspondingly gradually shrinks in a first direction away from the mating groove, and a bottom end of the first groove is arranged with chamfers;

the first surface is a plain surface;

the welding portion gradually shrinks in a direction away from the first surface, an inclined angle of the welding portion is smaller than an inclined angle of the fixing portion, and a bottom end of the welding portion is arranged with chamfers; and the second groove correspondingly gradually shrinks in a second direction away from the mating groove and opposite to the first direction, an inclined angle of the second groove is smaller an inclined angle of the first groove, and a bottom end of the second groove is arranged with chamfers.

19. The electrical connector according to claim 17, wherein the solder material is a solder block, a solder ball, or solder powder.

* * * * *